US012757664B2

(12) United States Patent
Kim et al.

(10) Patent No.: US 12,757,664 B2
(45) Date of Patent: Oct. 6, 2026

(54) DRY-TYPE CLEANSING APPARATUS FOR WAFERS

(71) Applicant: SEMES CO., LTD., Cheonan-si (KR)

(72) Inventors: Kwang Ryul Kim, Suwon-si (KR); Yun Sang Kim, Seongnam-si (KR)

(73) Assignee: SEMES CO., LTD., Cheonan-si (KR)

(*) Notice: Subject to any disclaimer, the term of this patent is extended or adjusted under 35 U.S.C. 154(b) by 917 days.

(21) Appl. No.: 17/860,084

(22) Filed: Jul. 7, 2022

(65) Prior Publication Data

US 2023/0207304 A1 Jun. 29, 2023

(30) Foreign Application Priority Data

Dec. 28, 2021 (KR) ........................ 10-2021-0189400

(51) Int. Cl.
*H10P 70/00* (2026.01)
*G02B 27/30* (2006.01)
*H01S 3/00* (2006.01)

(52) U.S. Cl.
CPC .............. *H10P 70/12* (2026.01); *G02B 27/30* (2013.01); *H01S 3/0014* (2013.01); *H01S 3/005* (2013.01)

(58) Field of Classification Search
CPC .... G02B 27/48; G02B 27/18; G02B 27/0927; G02B 27/0933; G02B 27/095; G02B 27/0955; G02B 27/0961; G02B 27/0977; G02B 27/0994; H01S 3/005; H01S 3/0014; H01L 21/02046
See application file for complete search history.

(56) References Cited

U.S. PATENT DOCUMENTS 5,643,472 A * 7/1997 Engelsberg ............. H10P 70/12 219/121.84
5,774,222 A * 6/1998 Maeda ............... G01N 21/8806 250/548
6,002,523 A * 12/1999 Tanaka ................ H10P 14/3454 359/624
6,176,926 B1 * 1/2001 Tanaka ............... G02B 27/0905 117/103
7,629,556 B2 * 12/2009 Rastegar ................. H10P 70/15 219/121.84
8,889,569 B2 * 11/2014 Im ........................... H10P 34/42 438/150

(Continued)

FOREIGN PATENT DOCUMENTS

JP H10323787 A * 12/1998
JP 2000-202385 7/2000

(Continued)

OTHER PUBLICATIONS

Office Action from the Korean Intellectual Property Office dated Aug. 29, 2023.

*Primary Examiner* — Wyatt A Stoffa

(57) ABSTRACT

A dry-type cleaning apparatus for wafers for dry cleaning of organic residues on a wafer surface includes a laser emitting laser light, an optical collimator receiving the laser light emitted from the laser and generating a first collimated laser light, an energy spreader uniformizing an energy distribution of the first collimated light received from the optical collimator, and a beam expander adjusting a diameter of the first collimated laser light passing through the energy spreader according to a diameter of a wafer to generate second laser light.

13 Claims, 4 Drawing Sheets

(56) References Cited

U.S. PATENT DOCUMENTS

| | | | | |
|---|---|---|---|---|
| 9,012,309 | B2 * | 4/2015 | Im | H10D 86/0227 257/306 |
| 11,378,808 | B2 * | 7/2022 | Hargis | G01N 21/645 |
| 11,742,221 | B2 * | 8/2023 | Shin | H01J 37/3244 134/105 |
| 12,172,235 | B2 * | 12/2024 | Vorontsov | B23K 26/044 |
| 12,266,898 | B2 * | 4/2025 | Vorontsov | H01S 3/10053 |
| 2002/0043561 | A1 * | 4/2002 | Tsikos | B82Y 15/00 257/E29.144 |
| 2002/0162973 | A1 * | 11/2002 | Cordingley | B23K 26/0736 250/492.23 |
| 2002/0166845 | A1 * | 11/2002 | Cordingley | B23K 26/0736 257/E23.15 |
| 2003/0138203 | A1 * | 7/2003 | Imakado | B23K 26/073 385/33 |
| 2003/0217995 | A1 * | 11/2003 | Toyofuku | B23K 26/384 219/121.84 |
| 2004/0084427 | A1 * | 5/2004 | Talwar | B23K 26/032 219/121.73 |
| 2005/0170572 | A1 * | 8/2005 | Hongo | B23K 26/0738 250/341.1 |
| 2006/0028655 | A1 * | 2/2006 | Cordingley | B23K 26/0736 257/E23.15 |
| 2006/0065640 | A1 * | 3/2006 | Lizotte | H01S 3/0057 219/121.61 |
| 2007/0020942 | A1 * | 1/2007 | Im | B23K 26/0676 438/719 |
| 2007/0163715 | A1 * | 7/2007 | Rastegar | H10P 70/15 156/345.5 |
| 2008/0296258 | A1 * | 12/2008 | Elliott | B23K 26/142 134/1 |
| 2011/0049114 | A1 * | 3/2011 | Barkhausen | B23K 26/082 219/121.77 |
| 2013/0141715 | A1 * | 6/2013 | Urano | G01N 21/94 356/237.2 |
| 2015/0179449 | A1 * | 6/2015 | Anikitchev | H10P 14/3814 438/799 |
| 2015/0218746 | A1 * | 8/2015 | Clowes | D06M 10/005 250/492.1 |
| 2015/0225891 | A1 * | 8/2015 | Clowes | C11D 3/3947 134/1 |
| 2017/0326688 | A1 * | 11/2017 | Turner | B23K 26/122 |
| 2020/0064276 | A1 * | 2/2020 | Lee | G01N 21/9501 |
| 2020/0083063 | A1 * | 3/2020 | Shin | H01J 37/3244 |
| 2020/0346304 | A1 * | 11/2020 | Kwon | B23K 26/0673 |
| 2020/0411322 | A1 * | 12/2020 | Lee | H10P 34/42 |
| 2021/0343552 | A1 * | 11/2021 | Shin | H01J 37/3244 |
| 2022/0365415 | A1 * | 11/2022 | Kim | G03F 1/22 |
| 2022/0415672 | A1 * | 12/2022 | Kim | H01J 37/32091 |
| 2023/0207304 | A1 * | 6/2023 | Kim | G02B 27/30 134/1 |
| 2024/0261897 | A1 * | 8/2024 | Grapov | B23K 26/082 |

FOREIGN PATENT DOCUMENTS

| | | |
|---|---|---|
| KR | 10-0631282 | 10/2006 |
| KR | 10-2007-0081838 | 8/2007 |
| KR | 10-1315981 | 11/2012 |

* cited by examiner

DRY-TYPE CLEANSING APPARATUS FOR WAFERS

CROSS REFERENCE TO RELATED APPLICATION

The present application claims priority to Korean Patent Application No. 10-2021-0189400, filed Dec. 28, 2021, the entire contents of which is incorporated herein for all purposes by this reference.

BACKGROUND OF THE INVENTION

Field of the Invention

The present disclosure relates generally to a dry-type cleaning apparatus for wafers. More particularly, the present disclosure relates to a dry-type cleaning apparatus for wafers, the apparatus being capable of effectively removing organic residues on a wafer surface using a laser.

Description of the Related Art

Various organic residues such as a photoresist (PR) residue, an isopropyl alcohol (IPT) residue, etc. exist on the surface of a dried wafer after a semiconductor supercritical process or wet cleaning process. These residues on the wafer surface have to be removed because they can affect the process yield. The residues have to be removed by dry cleaning because problems such as leaning occur when they are removed by wet cleaning.

As one of such a dry cleaning method, a device that cleans residual organic substances by heating a wafer above the thermal reaction temperature of organic substances (600° C. based on carbon) using a light generator or a heater is being developed or used. However, this device is problematic in that the process takes too much time and the cleaning efficiency is low.

The foregoing is intended merely to aid in the understanding of the background of the present disclosure, and is not intended to mean that the present disclosure falls within the purview of the related art that is already known to those skilled in the art.

SUMMARY OF THE INVENTION

Accordingly, the present disclosure has been made keeping in mind the above problems occurring in the related art, and an objective of the present disclosure provides a dry-type cleaning apparatus for wafers, the apparatus having a high efficiency of removing organic residues on a wafer while having a short operation time.

In order to accomplish the above objective, according to an aspect of the present disclosure, a dry-type cleaning apparatus for wafers for dry cleaning of organic residues on a wafer surface includes a laser emitting laser light, an optical collimator receiving the laser light emitted from the laser and generating a first collimated laser light, an energy spreader uniformizing an energy distribution of the first collimated light received from the optical collimator, and a beam expander adjusting a diameter of the first collimated laser light passing through the energy spreader according to a diameter of a wafer to generate second laser light.

According to an aspect of the present disclosure, a dry-type cleaning apparatus for wafers for dry cleaning of organic residues on a wafer surface includes a laser emitting laser light, a first energy spreader uniformizing an energy distribution of the laser light emitted from the laser, an optical collimator receiving the laser light passing through the first energy spreader and generating a first collimated laser light, an optical refractor refracting the first collimated laser light by at least one time, an angle of each refraction being an angle of 90 degrees, a second energy spreader uniformizing an energy distribution of the first collimated laser light passing through the optical refractor, and a beam expander adjusting a diameter of the first collimated laser light passing through the second energy spreader according to a diameter of a wafer.

According to an aspect of the present disclosure, a dry-type cleaning apparatus for wafers for dry cleaning of organic residues on a wafer surface includes a laser emitting laser light, a first energy spreader uniformizing an energy distribution of the laser light emitted from the laser, an optical collimator receiving the laser light passing through the first energy spreader and generating a first collimated laser light, an optical refractor refracting the first collimated laser light by an angle of 90 degrees, a second energy spreader uniformizing an energy spreader the first collimated laser light passing through the optical refractor, a beam expander adjust a diameter of the first collimated laser light passing through the second energy spreader according to a diameter of a wafer to generate a second laser light, a cooling unit configured to cool the wafer heated by the second laser light, an air jetting part provided at a side of the wafer and configured to jet an inert gas to the surface of the wafer, and an air suction part provided opposite to the air jetting part, configured to suck the inert gas jetted by the air jetting part and the organic residues on the surface of the wafer, and having a narrower width than the air jetting part.

According to the present disclosure, it is possible to provide a dry-type cleaning apparatus for wafers, the apparatus having a high efficiency of removing organic residues on a wafer while having a short operation time.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, exemplary embodiments of the present disclosure will be described in detail.

First, a description will be given of a dry-type cleaning apparatus for wafers according to a first embodiment of the present disclosure.

Figure 1:
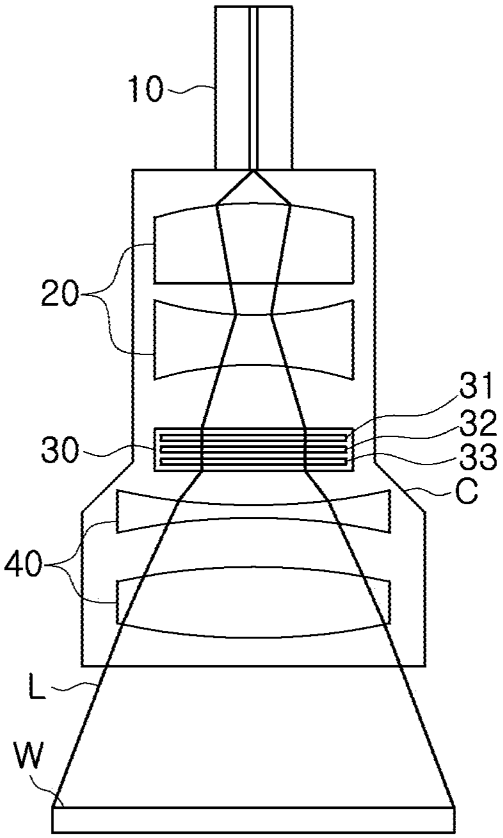
FIG. 1 is a view illustrating a dry-type cleaning apparatus for wafers according to a first embodiment of the present disclosure.

FIG. 1 is a view illustrating the dry-type cleaning apparatus for wafers according to the first embodiment of the present disclosure.

The dry-type cleaning apparatus for wafers according to the present embodiment is an apparatus for cleaning of organic residues on a wafer surface. As described in the background art, organic residues include a photoresist (PR) residue, an isopropyl alcohol (IPA) residue, etc. Laser cleans those organic residues mentioned above. Laser cleaning is known as a method of cleaning a wafer surface with three mechanisms: photo-mechanical, photo-chemical, and photo-thermal. In the present embodiment, the most related to the removal of organic substances being used is the photo-thermal mechanism. The principle of the photo-thermal mechanism is that when organic particles attached to the wafer surface are rapidly heated, they are suddenly expanded and separated from the wafer surface.

As illustrated in FIG. 1, the dry-type cleaning apparatus for wafers according to the embodiment includes a laser light source 10 (i.e., a laser), a collimation optical system 20 (e.g., an optical collimator), a uniformizing optical system 30 (i.e., an energy spreader), and an imaging optical system 40 (i.e., a beam expander).

The laser light source 10 is a configuration for emitting laser light L and may be a fiber light source, a $CO_2$ light source, etc. In the present embodiment, the laser light source 10 is a fiber light source.

The collimation optical system 20 is a configuration for causing the laser light L to travel in parallel. Collimated light is light whose rays are parallel. The collimation optical system 20 is a device for forming collimated laser light.

As briefly illustrated in FIG. 1, the collimation optical system 20 may include a plurality of lenses including a collimator lens.

The uniformizing optical system 30 is a configuration for uniformizing the laser light L passing through the collimation optical system 20.

To uniformize light means that a light amount (energy) is uniform at each point within a specific area to which the light is emitted. Although it is not possible to make the laser light L 100% uniform, the laser light L may be made close to uniform using various mechanisms. For this purpose, the uniformizing optical system 30 employing such mechanisms is used.

The uniformizing optical system 30 uniformizes the laser light L emitted to the surface of a wafer W, so that the organic residues existing in all areas of the surface of the wafer W can be effectively removed.

The uniformizing optical system 30 may include a diffractive optical element (DOE), which is an optical element that controls an optical path using a diffraction phenomenon due to an internal or surface periodic structure.

The uniformizing optical system 30 may include a micro lens array. The micro lens array refers to a plurality of lenses arranged in one or two dimensions on a substrate, and may be used for purposes such as collimating or focusing. In the present embodiment, the micro lens array is used for collimating.

The uniformizing optical system 30 may include a light pipe. The light pipe is a configuration for increasing the uniformity of light emitted from a light source and converting the light into direct light (light that illuminates a specific area or object) and may be used for collimating. In the present embodiment, the light pipe is used for collimating.

Meanwhile, the uniformizing optical system 30 may include any one or a combination of two of the light pipe, the DOE, and the micro lens array. This means that the uniformizing optical system 30 may be implemented in one of the following configurations: the light pipe and the DOE in which the collimated light from the collimation optical system passes through the light pipe and the DOE sequentially or vice versa; the light pipe and the micro lens array in which the collimated light from the collimation optical system passes through the light pipe and the micro lens array sequentially or vice versa; the light pipe, the DOE, and the micro lens array in which the collimated light from the collimation optical system passes through the light pipe, the DOE, and the micro lens array arranged in various orders.

The imaging optical system 40 is a configuration for adjusting the laser light L passing through the uniformizing optical system 30 according to the size of the wafer W, and may be composed of a combination of lenses such as a convex lens, a concave lens, etc. As illustrated in FIG. 1, in the case of the need to diffuse the laser light L, a concave lens is used.

The laser light L emitted from the laser light source 10 is collimated into parallel light while passing through the collimation optical system 20 and the uniformizing optical system 30 and then passes through the imaging optical system 40. The laser light L is adjusted (diffused or reduced) according to the size of the wafer W by the imaging optical system 40 and then reaches the wafer W.

The laser light L reaching the wafer W provides energy to the surface of the wafer W. As the surface of the wafer W is heated, the organic residues on the surface of the wafer W are separated and removed from the wafer W.

In an embodiment, the imaging optical system 40 may serve as a beam expander that receives a first collimated laser beam having a first diameter and outputs a second collimated laser beam having a second diameter greater than the first diameter. For example, the first collimated laser beam may be the collimated light generated from the collimation optical system 20, and the second collimated laser beam may be laser light having the second diameter of the wafer diameter.

The dry-type cleaning apparatus for wafers illustrated in FIG. 1 is the most circular dry-type cleaning apparatus for briefly describing the configuration of the laser light source 10, the collimation optical system 20, the uniformizing optical system 30, and the imaging optical system 40.

Hereinafter, a dry-type cleaning apparatus for wafers according to a second embodiment of the present disclosure will be described in detail with reference to the drawings. The dry-type cleaning apparatus according to the present embodiment is implemented by adding several configurations to the dry-type cleaning apparatus according to the previous embodiment. The additional configurations will be mainly described, and the configurations included in the previous embodiment will be briefly described.

Figure 2:
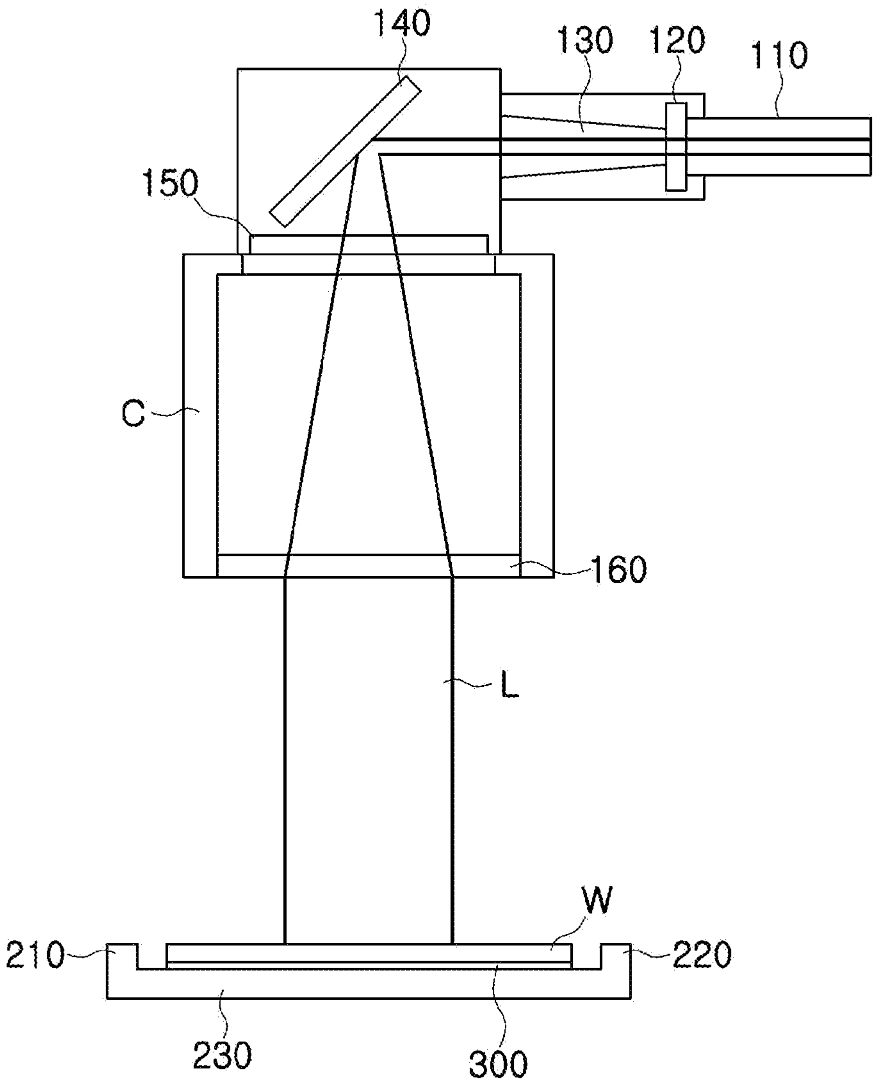
FIG. 2 is a view illustrating a dry-type cleaning apparatus for wafers according to a second embodiment of the present disclosure.
Figure 3:
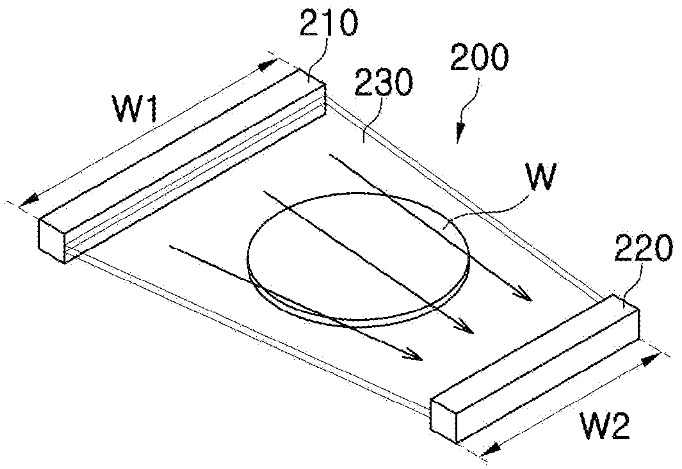
FIG. 3 is a view illustrating a particle removal unit.

FIG. 2 is a view illustrating the dry-type cleaning for wafers according to the second embodiment of the present disclosure. FIG. 3 is a view illustrating a particle removal unit.

The dry-type cleaning apparatus for wafers according to the present embodiment further includes a refraction optical system, a particle removal unit, and a cooling unit, compared to the dry-type cleaning apparatus for wafers according to the previous embodiment. Laser light L emitted from a laser light source 110 sequentially passes through a first uniformizing optical system 120, a collimation optical system 130, a refraction optical system 140, a second uniformizing optical system 150, and an imaging optical system 160 and then is emitted to a wafer W.

The first uniformizing optical system 120 and the second uniformizing optical system 150 remain substantially the same as the above-described uniformizing optical system of the first embodiment, and the collimation optical system 130 and the imaging optical system 160 also remain substantially the same as those of the first embodiment. Thus, an additional description thereof will be omitted.

The refraction optical system 140 is a configuration for refracting the laser light L to change the direction of the laser light L and may be a mirror.

In the present embodiment, the refraction optical system 140 is used because, in the case where the laser light source 110 is a fiber light source, handling may be difficult when the fiber light source is installed vertically. Therefore, the fiber-type laser light source 110 is installed in a horizontal direction and the laser light L is refracted in a vertical direction by the refraction optical system 140.

The particle removal unit is a configuration for effectively removing, when organic particles attached to surface of the wafer W are expanded by being rapidly heated by the laser light L emitted to the wafer W and thereby separated from the wafer W, the organic particles, and includes an air jetting part, an air suction part 220, and a flow path 230.

As illustrated in FIG. 3, the air jetting part 210 is a configuration for jetting an inert gas to the surface of the wafer W. The air suction part 220 is provided opposite to the air jetting part 210 to suck the inert gas jetted by the air jetting part 210 and the organic residues on the surface of the wafer W, and is connected to a vacuum pump.

Meanwhile, the air suction part 220 has a narrow width due to the air jetting part 210. With this configuration, the flow rate of the inert gas is gradually increased toward the air suction part 220.

Under the condition in which the flow rate is constant, as the flow cross-sectional area is decreased, the moving speed of fluid is increased. The narrow width of the air suction part 220 means that the flow cross-sectional area of the air suction part 220 is decreased and thus the moving speed of fluid is increased.

By increasing the moving speed of the inert gas, efficient removal of particles (organic residues) from the surface of the wafer W can be advantageously expected.

The flow path 230 is installed between the air jetting part 210 and the air suction part 220 to allow the inert gas to flow therein. The wafer W is disposed in the flow path 230.

The cooling unit 300 is disposed under the wafer W and is a configuration for cooling the wafer W heated by the laser light L. According to research by Myeong-hwa Lee and others (Surface Cleaning of a Wafer Contaminated by Fingerprint Using a Laser Cleaning Technology, published in the Journal of the Institute for Liquid Atomization and Spray Systems-Korea, Vol. 12, No. 4), when a wafer is cooled, the organic substance removal efficiency may be decreased due to a photo-thermal mechanism. Thus, it is preferable to operate the cooling unit 300 after emitting the laser light L and removing the particles by the particle removal unit 200.

Figure 4:
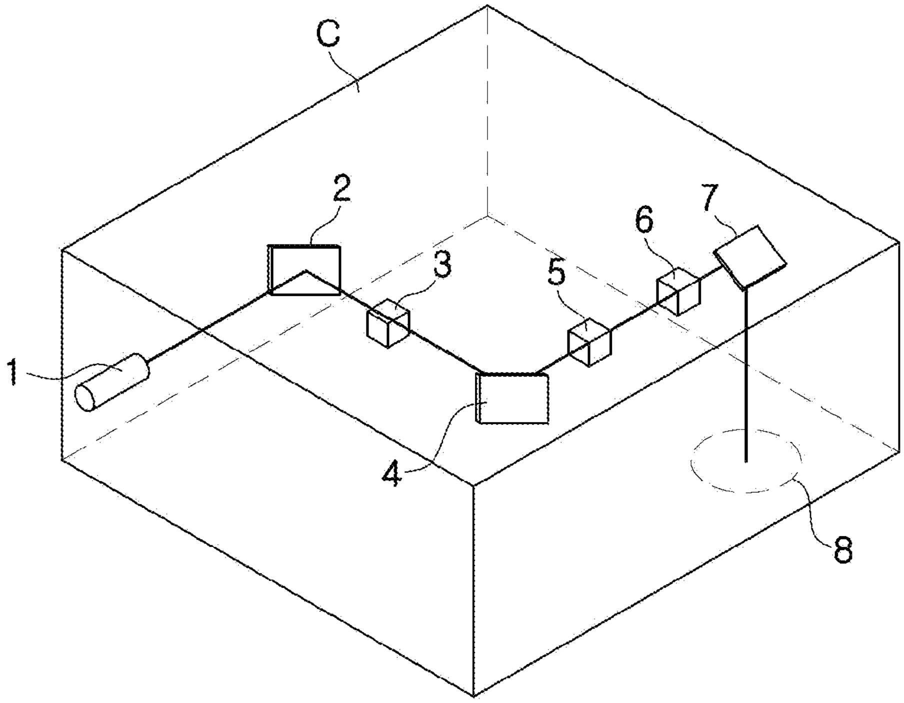
FIGS. 4 to 6 are views illustrating a dry-type cleaning apparatus for wafers according to a third embodiment of the present disclosure.
Figure 5:
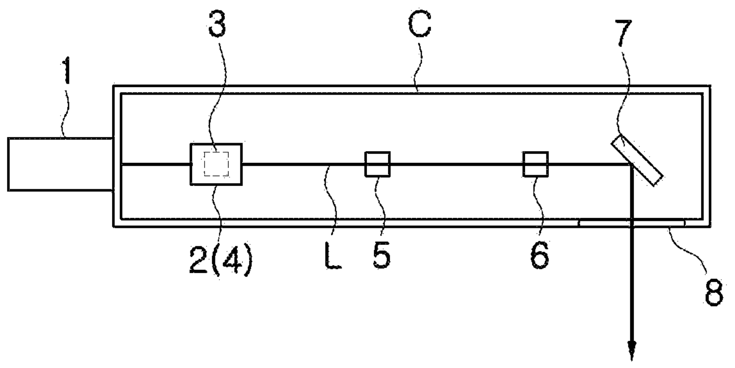
Figure 6:
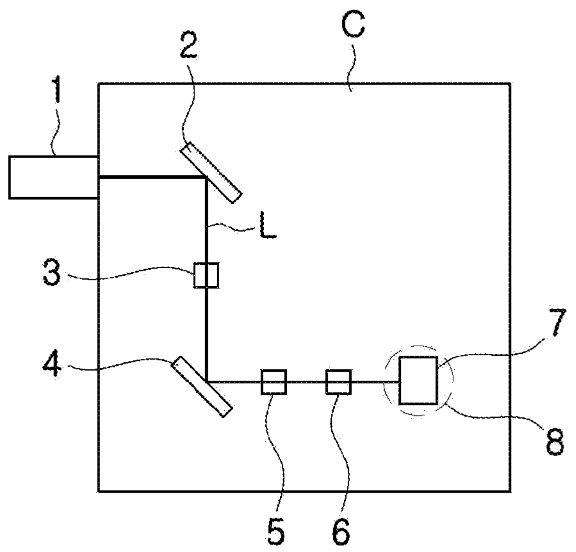

A dry-type cleaning apparatus for wafers according to a third embodiment of the present disclosure illustrated in FIGS. 4 to 6 employs the use of a plurality of refraction optical systems. The present embodiment is configured to have, when there is a height limit in the installation of the dry-type cleaning apparatus for wafers, a horizontal long laser light path, rather than a horizontal long laser light path as in the embodiment illustrated in FIG. 1 or 2.

Laser light L emitted from a laser light source 1 is refracted three times by a first refraction optical system 2, a second refraction optical system 4, and a third refraction optical system 7 and then emitted downwardly to reach a wafer W through a through-hole 8.

Reference numerals 3, 5, and 6 denote optical systems. As the optical systems, a uniformizing optical system, a collimation optical system, and an imaging optical system may be used. Although only three optical systems are briefly illustrated in the drawings, the number and type thereof are not limited.

Meanwhile, in FIGS. 1 to 6, reference numeral C denotes a casing in which various optical systems are received.

The description of the present disclosure has been presented with reference to the accompanying drawings for purposes of illustration and description, but is not intended to be exhaustive or limited to the disclosure in the form disclosed. Many modifications and variations will be apparent to those of ordinary skill in the art without departing from the scope and spirit of the disclosure. Accordingly, all such modifications and variations are intended to be included within the scope of this disclosure as defined in the appended claims.

What is claimed is:

1. A dry-type cleaning apparatus for wafers for dry cleaning of organic residues on a wafer surface, the dry-type cleaning apparatus comprising:
- a laser emitting laser light;
- a first energy spreader uniformizing an energy distribution of the laser light emitted from the laser;
- an optical collimator receiving the laser light passing through the first energy spreader and generating a first collimated laser light;
- an optical refractor refracting the first collimated laser light at least one time, an angle of each refraction being an angle of 90 degrees;
- a second energy spreader uniformizing an energy distribution of the first collimated laser light passing through the optical refractor; and
- a beam expander adjusting a diameter of the first collimated laser light passing through the second energy spreader according to a diameter of a wafer.

2. The dry-type cleaning apparatus of claim 1,
- wherein at least one of the first energy spreader and the second energy spreader comprises a diffractive optical element (DOE).

3. The dry-type cleaning apparatus of claim 1,
- wherein at least one of the first energy spreader and the second energy spreader comprises a micro lens array.

4. The dry-type cleaning apparatus of claim 1,
- wherein at least one of the first energy spreader and the second energy spreader comprises a light pipe.

5. The dry-type cleaning apparatus of claim 1,
- wherein at least one of the first energy spreader and the second energy spreader comprises at least two of a light pipe, a diffractive optical element (DOE), and a micro lens array.

6. The dry-type cleaning apparatus of claim 1,
- wherein the optical refractor refracting the first collimated laser light by an angle of 90 degrees.

7. The dry-type cleaning apparatus of claim 1, further comprising:
- a cooling unit disposed under the wafer and configured to cool the wafer.

8. The dry-type cleaning apparatus of claim 1, further comprising:
- a particle removal unit configured to provide an air flow for removing the organic residues separated from the wafer by the second laser light emitted to the wafer.

9. The dry-type cleaning apparatus of claim 8,
- wherein the particle removal unit comprises:
- an air jetting part provided at a side of the wafer and configured to jet gas to the surface of the wafer; and an air suction part provided opposite to the air jetting part and configured to suck the gas jetted by the air jetting part and the organic residues on the surface of the wafer.

10. The dry-type cleaning apparatus of claim 9, wherein the air jetting part has a wider width than the air suction part.

11. The dry-type cleaning apparatus of claim 8, wherein the gas jetted from the air jetting part is an inert gas.

12. The dry-type cleaning apparatus of claim 1, wherein the optical refractor includes:

a first optical refractor refracting the first collimated laser light by an angle of 90 degrees, and a second optical refractor refracting the first collimated laser light refracted by the first optical refractor by an angle of 90 degrees.

13. A dry-type cleaning apparatus for wafers for dry cleaning of organic residues on a wafer surface, the dry-type cleaning apparatus comprising:

a laser emitting laser light;

a first energy spreader uniformizing an energy distribution of the laser light emitted from the laser;

an optical collimator receiving the laser light passing through the first energy spreader and generating a first collimated laser light;

an optical refractor refracting the first collimated laser light by an angle of 90 degrees;

a second energy spreader uniformizing an energy distribution of the first collimated laser light passing through the optical refractor;

a beam expander adjusting a diameter of the first collimated laser light passing through the second energy spreader according to a diameter of a wafer to generate a second laser light;

a cooling unit configured to cool the wafer heated by the second laser light;

an air jetting part provided at a side of the wafer and configured to jet an inert gas to the surface of the wafer; and an air suction part provided opposite to the air jetting part, configured to suck the inert gas jetted by the air jetting part and the organic residues on the surface of the wafer, and having a narrower width than the air jetting part.

* * * * *